US010026789B1

(12) United States Patent
Wang et al.

(10) Patent No.: US 10,026,789 B1
(45) Date of Patent: Jul. 17, 2018

(54) TOUCH DISPLAY SUBSTRATE, TOUCH DISPLAY APPARATUS HAVING THE SAME, PIXEL ARRANGEMENT, AND FABRICATING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haisheng Wang, Beijing (CN); Xue Dong, Beijing (CN); Hailin Xue, Beijing (CN); Xiaochuan Chen, Beijing (CN); Xiaoliang Ding, Beijing (CN); Shengji Yang, Beijing (CN); Yingming Liu, Beijing (CN); Weijie Zhao, Beijing (CN); Changfeng Li, Beijing (CN); Wei Liu, Beijing (CN); Pengpeng Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/533,127

(22) PCT Filed: Jun. 17, 2016

(86) PCT No.: PCT/CN2016/086155
§ 371 (c)(1),
(2) Date: Jun. 5, 2017

(87) PCT Pub. No.: WO2017/214971
PCT Pub. Date: Dec. 21, 2017

(51) Int. Cl.
H01L 27/32 (2006.01)
G06F 3/044 (2006.01)
(Continued)

(52) U.S. Cl.
CPC ............ H01L 27/323 (2013.01); G06F 3/044 (2013.01); G06F 3/0412 (2013.01);
(Continued)

(58) Field of Classification Search
CPC . H01L 27/323; H01L 27/322; H01L 27/3262; H01L 27/3276; H01L 2227/323;
(Continued)

(56) References Cited

U.S. PATENT DOCUMENTS

2008/0150848 A1*  6/2008  Chung ................. G06F 3/0412
                                                    345/82
2011/0102692 A1*  5/2011  Shih ..................... G06F 3/0412
                                                    349/38
(Continued)

FOREIGN PATENT DOCUMENTS

CN    101763822 A    6/2010
CN    102738199 A    10/2012
(Continued)

OTHER PUBLICATIONS

International Search Report & Written Opinion dated Mar. 16, 2017 regarding PCT/CN2016/086155.

Primary Examiner — Ariel Balaoing
(74) Attorney, Agent, or Firm — Intellectual Valley Law, P.C.

(57) ABSTRACT

The present application discloses a touch display substrate including an array of a plurality of pixels. Each pixel includes a first region and a second region in plan view of the touch display substrate. Each pixel includes a first electrode layer on a base substrate comprising a plurality of
(Continued)

first electrode blocks in the first region, each of which corresponding to a subpixel; and a second electrode block in the second region; a first light emitting layer in the first region on a side of the plurality of first electrode blocks distal to the base substrate; a second light emitting layer in the second region on a side of the second electrode block distal to the base substrate; a second electrode layer in the first region on a side of the first light emitting layer distal to the plurality of first electrode blocks; and a touch electrode layer in the second region on a side of the second light emitting layer distal to the second electrode block; the touch electrode layer and the second electrode layer spaced apart and electrically insulated from each other.

20 Claims, 7 Drawing Sheets

(51) Int. Cl.
  *G06F 3/041* (2006.01)
  *G09G 3/32* (2016.01)
  *G09G 3/3225* (2016.01)
(52) U.S. Cl.
  CPC .......... *G06F 3/0416* (2013.01); *H01L 27/322* (2013.01); *H01L 27/3262* (2013.01); *H01L 27/3276* (2013.01); *G06F 2203/04103* (2013.01); *G09G 3/3225* (2013.01); *G09G 2300/0452* (2013.01); *H01L 2227/323* (2013.01)

(58) Field of Classification Search
  CPC ...... G06F 3/0412; G06F 3/0416; G06F 3/044; G06F 2203/04103; G09G 3/3225; G09G 2227/323
  See application file for complete search history.

(56) References Cited

U.S. PATENT DOCUMENTS

| | | | |
|---|---|---|---|
| 2012/0154728 A1* | 6/2012 | Oh | H01L 27/124 349/138 |
| 2012/0182518 A1* | 7/2012 | Ho | G09G 3/3233 349/192 |
| 2012/0249454 A1 | 10/2012 | Teraguchi et al. | |
| 2014/0043281 A1* | 2/2014 | Kim | G06F 3/044 345/174 |
| 2015/0041778 A1 | 2/2015 | Chang et al. | |
| 2016/0018918 A1* | 1/2016 | Chen | G06F 3/042 345/175 |
| 2016/0155385 A1* | 6/2016 | Yang | G09G 3/3233 345/174 |
| 2017/0090246 A1* | 3/2017 | Seo | G02F 1/133553 |
| 2017/0092174 A1* | 3/2017 | Cote | G09G 3/2003 |
| 2017/0269745 A1* | 9/2017 | Ding | G06F 3/0412 |

FOREIGN PATENT DOCUMENTS

| | | |
|---|---|---|
| CN | 105243993 A | 1/2016 |
| CN | 105493013 A | 4/2016 |
| KR | 20110076597 A | 7/2011 |
| TW | 201506723 A | 2/2015 |

* cited by examiner

US 10,026,789 B1

TOUCH DISPLAY SUBSTRATE, TOUCH DISPLAY APPARATUS HAVING THE SAME, PIXEL ARRANGEMENT, AND FABRICATING METHOD THEREOF

CROSS-REFERENCE TO RELATED APPLICATION

This application is a national stage application under 35 U.S.C. § 371 of International Application No. PCT/CN2016/086155 filed Jun. 17, 2016, the contents of which are incorporated by reference in the entirety.

TECHNICAL FIELD

The present invention relates to display technology, more particularly, to a touch display substrate, a touch display apparatus having the same, a pixel arrangement, and a fabricating method thereof.

BACKGROUND

Organic light emitting diodes (OLED) use the principles of electrophosphorescence to convert electrical energy in an OLED into light in a highly efficient manner. OLEDs are self-emitting apparatuses that do not require a backlight. Having the advantages of a wide viewing angle, high contrast, fast response, high flexibility, a wide working temperature range, and a simpler structure and manufacturing process, they have found a wide range of applications in display field.

In conventional touch display organic light emitting apparatuses, a touch module is added onto the display module. The display module and the touch module may be manufactured separately. The touch module is bonded onto the display panel. This type of touch display panel has a large thickness and is prone to damage.

SUMMARY

In one aspect, the present invention provides a touch display substrate, comprising: an array of a plurality of pixels, each pixel having a first region and a second region in plan view of the touch display substrate, each pixel comprising a first electrode layer on a base substrate comprising a plurality of first electrode blocks in the first region, each of which corresponding to a subpixel; and a second electrode block in the second region; a first light emitting layer in the first region on a side of the plurality of first electrode blocks distal to the base substrate; a second light emitting layer in the second region on a side of the second electrode block distal to the base substrate; a second electrode layer in the first region on a side of the first light emitting layer distal to the plurality of first electrode blocks; and a touch electrode layer in the second region on a side of the second light emitting layer distal to the second electrode block; the touch electrode layer and the second electrode layer spaced apart and electrically insulated from each other.

Optionally, each pixel further comprises a pattern spacer layer on the base substrate dividing the pixel into the first region and the second region; the pattern spacer layer spacing apart and electrically insulating the touch electrode layer and the second electrode layer; and the pattern spacer layer spacing apart and electrically insulating the first light emitting layer and the second light emitting layer.

Optionally, the touch electrode layer is in a same layer as the second electrode layer, and the first light emitting layer is in a same layer as the second light emitting layer.

Optionally, one second electrode block in the second region is electrically connected to the touch electrode layer.

Optionally, the one second electrode block in the second region is electrically connected to the touch electrode layer through a conductive channel in the second light emitting layer, the conductive channel comprising a sintered conductive material comprising at least one of a light emitting material of the second light emitting layer, a conductive material of the one second electrode block in the second region, and a conductive material of the touch electrode layer.

Optionally, the touch display substrate further comprises a plurality of electrode lead wires in the first region and a plurality of touch control lead wires in the second region; the plurality of touch control lead wires in a same layer as the plurality of electrode lead wires; the plurality of touch control lead wires electrically connected to the touch electrode layer through a conductive channel in the second light emitting layer, the conductive channel comprising a sintered conductive material comprising at least one of a light emitting material of the second light emitting layer, a conductive material of a touch control lead wire in the second region, and a conductive material of the touch electrode layer.

Optionally, each pixel further comprises a pixel compensation circuit in the second region.

Optionally, each pixel comprises a subpixel of a first color, a subpixel of a second color, a subpixel of a third color in the first region, and a plurality of pixel compensation circuits in the second region; each pixel compensation circuit is connected to one of the subpixel of the first color from a same pixel, the subpixel of the second color and the subpixel of the third color from adjacent pixels.

Optionally, each second region is surrounded by the subpixel of the first color from the same pixel, the subpixel of the second color from a first adjacent pixel, and two subpixels of the third color respectively from a second and a third adjacent pixels; the first color, the second color, and the third color are different colors selected form red, green, and blue.

Optionally, each pixel comprises three pixel compensation circuits, each pixel compensation circuit is connected to one of the subpixel of the first color from a same pixel, the subpixel of the second color from a first adjacent pixel, and the subpixel of the third color from a second adjacent pixel.

Optionally, each pixel comprises four pixel compensation circuits, each pixel compensation circuit is connected to one of the subpixel of the first color from a same pixel, the subpixel of the second color from a first adjacent pixel, the subpixel of the third color from a second adjacent pixel, and the subpixel of the third color from a third adjacent pixel.

Optionally, each pixel comprises a subpixel of a first color, a subpixel of a second color, a subpixel of a third color in the first region, a touch subpixel in the second region, the touch electrode layer is configured to operate in a time-division driving mode, the time-division mode comprising a display mode and a touch control mode, the touch electrode layer is a touch control electrode for conducting touch signals during the touch control mode, and one second electrode block in the second region and the touch electrode layer are electrodes for applying voltage signal to the second light emitting layer during display mode; each pixel further comprises four pixel compensation circuits, each pixel compensation circuit is connected to one of the subpixel of the first color from a same pixel, the subpixel of the second color from a first adjacent pixel, the subpixel of the third color from a second adjacent pixel, and the touch subpixel.

Optionally, the first light emitting layer is an integral white light emitting layer; each pixel further comprises a plurality of color filters on a side of the second electrode layer distal to the first light emitting layer, each of which corresponding to a subpixel.

Optionally, the touch electrode layer is configured to operate in a time-division driving mode, the time-division mode comprising a display mode and a touch control mode, the touch electrode layer is a touch control electrode for conducting touch signals during the touch control mode, and one second electrode block in the second region and the touch electrode layer are electrodes for applying voltage signal to the second light emitting layer during display mode.

Optionally, the touch display substrate further comprises a plurality of thin film transistors on a p-silicon substrate, each of which corresponding to one first electrode block or one second electrode block.

Optionally, the first electrode layer is an anode layer, and the second electrode layer is a cathode layer.

In another aspect, the present invention provides a pixel arrangement comprising an array of a plurality of pixels, wherein each pixel comprises a subpixel of a first color, a subpixel of a second color, a subpixel of a third color, a touch subpixel; and a plurality of pixel compensation circuits in the touch subpixel; each pixel compensation circuit is connected to one of the subpixel of the first color from a same pixel, the subpixel of the second color and the subpixel of the third color from adjacent pixels; and each touch subpixel is surrounded by the subpixel of the first color from a same pixel, the subpixel of the second color from a first adjacent pixel, and two subpixels of the third color respectively from a second and a third adjacent pixels.

Optionally, each pixel comprises three pixel compensation circuits, each pixel compensation circuit is connected to one of the subpixel of the first color from a same pixel, the subpixel of the second color from a first adjacent pixel, the subpixel of the third color from a second adjacent pixel.

Optionally, each pixel comprises four pixel compensation circuits, each pixel compensation circuit is connected to one of the subpixel of the first color from a same pixel, the subpixel of the second color from a first adjacent pixel, the subpixel of the third color from a second adjacent pixel, and the subpixel of the third color from a third adjacent pixel.

Optionally, each pixel comprises four pixel compensation circuits, each pixel compensation circuit is connected to one of the subpixel of the first color from a same pixel, the subpixel of the second color from a first adjacent pixel, the subpixel of the third color from a second adjacent pixel, and the touch subpixel.

In another aspect, the present invention provides a method of fabricating a touch display substrate comprising forming an array of a plurality of pixels, each pixel comprising a first region and a second region in plan view of the touch display substrate; wherein forming each pixel comprising forming a first electrode layer on a base substrate; the step of forming the first electrode layer comprising forming a plurality of first electrode blocks in the first region, each of which corresponding to a subpixel; and forming a second electrode block in the second region; forming a first light emitting layer in the first region on a side of the plurality of first electrode blocks distal to the base substrate; forming a second light emitting layer in the second region on a side of the second electrode block distal to the base substrate; forming a second electrode layer in the first region on a side of the first light emitting layer distal to the plurality of first electrode blocks; and forming a touch electrode layer in the second region on a side of the second light emitting layer distal to the second electrode block; the touch electrode layer and the second electrode layer spaced apart and electrically insulated from each other.

Optionally, the method further comprises forming a pattern spacer layer on the base substrate dividing each pixel into the first region and the second region; the pattern spacer layer spacing apart and electrically insulating the touch electrode layer and the second electrode layer; and the pattern spacer layer spacing apart and electrically insulating the first light emitting layer and the second light emitting layer.

Optionally, the pattern spacer layer is made of a photoresist material, the step of forming each pixel comprises depositing a photoresist layer on the base substrate having the first electrode layer; exposing the photoresist layer with a mask plate having a pattern corresponding to the pattern spacer layer; developing the exposed photoresist layer thereby forming the pattern spacer layer, depositing an organic light emitting material layer on a side of the first electrode layer distal to the base substrate having the pattern spacer layer, thereby forming the first light emitting layer in the first region and the second light emitting layer in the second region; and depositing an electrode material layer on a side of the organic light emitting material layer distal to the first electrode layer, thereby forming the second electrode layer in the first region and the touch electrode layer in the second region.

Optionally, the method further comprises electrically connecting one second electrode block in the second region to the touch electrode layer.

Optionally, the step of electrically connecting the one second electrode block in the second region to the touch electrode layer comprises sintering a portion of a multilayer structure comprising the one second electrode block in the second region, the second light emitting layer, and the touch electrode layer; and forming a conductive channel in the second light emitting layer, the conductive channel comprising a sintered conductive material comprising at least one of a light emitting material, a conductive material of the one second electrode block, and a conductive material of the touch electrode layer.

Optionally, the step of forming each pixel further comprises forming a pixel compensation circuit in the second region.

Optionally, the first region comprises a subpixel of a first color, a subpixel of a second color, a subpixel of a third color; forming each pixel comprises forming a plurality of pixel compensation circuits in the second region, each of which connected to one of the subpixel of the first color from a same pixel, the subpixel of the second color and the subpixel of the third color from adjacent pixels; the method comprising forming the array of the plurality of pixels so that each second region is surrounded by the subpixel of the first color from a same pixel, the subpixel of the second color from an adjacent pixel, and two subpixels of the third color respectively from two other adjacent pixels.

Optionally, the touch electrode layer is formed in a same layer as the second electrode layer, and the first light emitting layer is formed in a same layer as the second light emitting layer.

Optionally, the method further comprises forming a plurality of electrode lead wires in the first region and a plurality of touch control lead wires in the second region in a same layer; and electrically connecting the plurality of touch control lead wires to the touch electrode layer through a conductive channel in the second light emitting layer; wherein the step of electrically connecting the plurality of touch control lead wires to the touch electrode layer comprises sintering a portion of a multilayer structure comprising a touch control lead wire in the second region, the second light emitting layer, and the touch electrode layer; and forming a conductive channel in the second light emitting layer, the conductive channel comprising a sintered conductive material comprising at least one of a light emitting material, a conductive material of the touch control lead wire, and a conductive material of the touch electrode layer.

In another aspect, the present invention provides a touch display apparatus comprising a touch display substrate described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
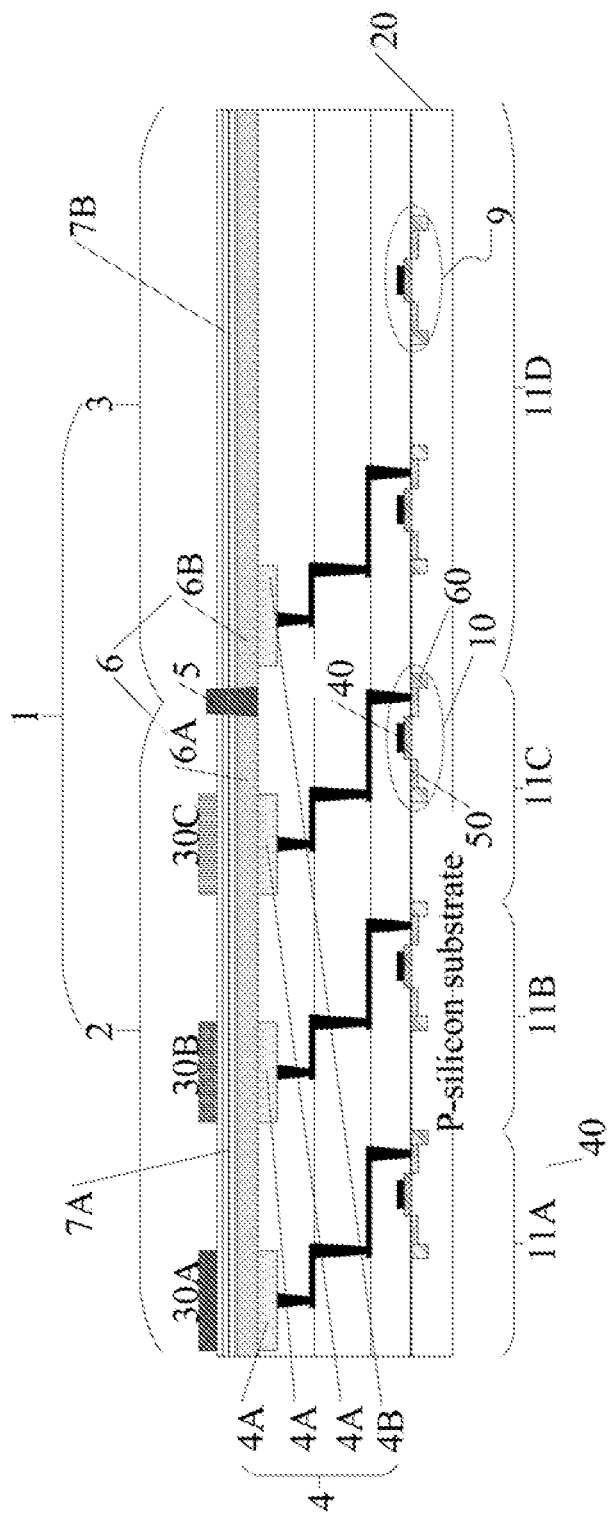
FIG. 1A is a diagram illustrating the structure of a touch display substrate in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a novel in-cell touch display substrate, a touch display apparatus having the same, and a fabricating method thereof. In some embodiments, the present touch display substrate utilizes a subpixel area of each pixel as a touch sensor area, and electrically insulating a portion of the cathode (or anode) as the touch electrode. The present design provides a compact in-cell touch structure which may be manufactured together with the display module. Moreover, the touch lead wires may be optionally disposed in a same layer as the electrode lead wires for cathode or anode, the touch electrode and the touch lead wires may be electrically connected by sintering a portion of the light emitting layer. To further decrease the thickness and increase the aperture ratio of the display substrate, the touch display substrate may be designed to have a novel pixel arrangement so that multiple pixel compensation circuits from multiple subpixels may be disposed in a same touch subpixel area.

In some embodiments, the present touch display substrate includes an array of a plurality of pixels. Each pixel includes a first region and a second region in plan view of the touch display substrate. In some embodiments, each pixel includes a first electrode layer on a base substrate comprising a plurality of first electrode blocks in the first region, each of which corresponding to a subpixel, and at least one second electrode block in the second region; a first light emitting layer in the first region on a side of the plurality of first electrode blocks distal to the base substrate; a second light emitting layer in the second region on a side of the second electrode block distal to the base substrate; a second electrode layer in the first region on a side of the first light emitting layer distal to the plurality of first electrode blocks; and a touch electrode layer in the second region on a side of the second light emitting layer distal to the second electrode block. Optionally, the touch electrode layer and the second electrode layer spaced apart and electrically insulated from each other. Optionally, the first light emitting layer and the second light emitting layer are spaced apart and electrically insulated from each other. Optionally, the touch electrode layer is in a same layer as the second electrode layer. Optionally, the first light emitting layer is in a same layer as the second light emitting layer. Optionally, the touch electrode layer and the second electrode layer spaced apart and electrically insulated from each other, the first light emitting layer and the second light emitting layer are spaced apart and electrically insulated from each other, the touch electrode layer is in a same layer as the second electrode layer, and the first light emitting layer is in a same layer as the second light emitting layer.

In another aspect, the present disclosure provides a method of fabricating a touch display substrate described herein. The touch display substrate includes an array of a plurality of pixels, with each pixel including a first region and a second region in plan view of the touch display substrate. In some embodiments, the step of forming each pixel includes forming a first electrode layer on a base substrate; the step of forming the first electrode layer comprising forming a plurality of first electrode blocks in the first region, each of which corresponding to a subpixel; and forming a second electrode block in the second region; forming a first light emitting layer in the first region on a side of the plurality of first electrode blocks distal to the base substrate; forming a second light emitting layer in the second region on a side of the second electrode block distal to the base substrate; forming a second electrode layer in the first region on a side of the first light emitting layer distal to the plurality of first electrode blocks; and forming a touch electrode layer in the second region on a side of the second light emitting layer distal to the second electrode block. Optionally, the touch electrode layer and the second electrode layer are formed to be spaced apart and electrically insulated from each other. Optionally, the first light emitting layer and the second light emitting layer are formed to be spaced apart and electrically insulated from each other. Optionally, the touch electrode layer is formed in a same layer as the second electrode layer. Optionally, the first light emitting layer is formed in a same layer as the second light emitting layer. Optionally, the touch electrode layer and the second electrode layer are formed to be spaced apart and electrically insulated from each other, the first light emitting layer and the second light emitting layer are formed to be spaced apart and electrically insulated from each other, the touch electrode layer is formed in a same layer as the second electrode layer, and the first light emitting layer is formed in a same layer as the second light emitting layer.

Various methods may be practiced to space apart and electrically insulate the touch electrode layer from the second electrode layer, and the first light emitting layer from the second light emitting layer. For example, the patterns of the first light emitting layer, the second light emitting layer, the touch electrode layer, and the second electrode layer may be formed using a mask plate so that there is a gap between the first light emitting layer from the second light emitting layer, and a gap between the touch electrode layer and the second electrode layer. In some embodiments, a single light emitting layer may be formed in a single process (e.g., a deposition process), and the single light emitting layer may be patterned to form the first light emitting layer and the second light emitting layer (e.g., etching a gap in the single light emitting layer dividing it into two layers). Similarly, a single electrode layer may be formed in a single process (e.g., a deposition process), and the single electrode layer may be patterned to form the touch electrode layer and the second electrode layer (e.g., etching a gap in the single electrode layer dividing it into two layers).

In some embodiments, each pixel includes a pattern spacer layer on the base substrate dividing the pixel into the first region and the second region. The pattern spacer layer spaces apart and electrically insulates the touch electrode layer and the second electrode layer from each other. Optionally, the pattern spacer layer spaces apart and electrically insulates the first light emitting layer and the second light emitting layer from each other.

Accordingly, the step of forming each pixel may optionally include forming a pattern spacer layer on the base substrate dividing each pixel into the first region and the second region. The pattern spacer layer is formed to space apart and electrically insulate the touch electrode layer and the second electrode layer; and space apart and electrically insulate the first light emitting layer and the second light emitting layer.

FIG. 1A is a diagram illustrating the structure of a touch display substrate in some embodiments. Referring to FIG. 1A, the touch display substrate in the embodiment includes an array of a plurality of pixels 1. Each pixel 1 may include a plurality of subpixels, e.g., subpixels 11A, 11B, 11C, and 11D. As shown in FIG. 1A, the touch display substrate in the embodiment includes a first electrode layer 4 on a base substrate 20. The first electrode layer 4 includes a plurality of first electrode blocks, e.g., 4A and a second electrode block, in other words one or more second electrode block, e.g., 4B. Moreover, the touch display substrate includes a pattern spacer layer 5 dividing the pixel 1 into a first region 2 and a second region 3 in plan view of the base substrate 20. The first region 2 includes a plurality of subpixels 11A, 11B, and 11C capable of image display, each of which includes a driving thin film transistor 10. The second region 3 includes at least one touch subpixel 11D for touch control. Optionally, the touch subpixel 11D is also capable of image display. Optionally, the touch subpixel 11D includes a driving thin film transistor 10. Each driving thin film transistor 10 is electrically connected to a first electrode block 4A or a second electrode block 4B.

Various embodiments may be practiced to make and use the touch display substrate. For example, the base substrate may be made of any appropriate material, e.g., glass, quartz, or a transparent resin. The thin film transistor 10 may be a thin film transistor including a gate electrode, a source electrode, a drain electrode, and an active layer. 10054) In some embodiments, the base substrate is a p+ silicon substrate. As shown in FIG. 1A, the thin film transistor 10 may be a thin film transistor including a gate structure 40, an N-well 50, and a field oxide (FOX) isolation structure 60. In some embodiments, the base substrate is an n+ silicon substrate. Optionally, the thin film transistor including a gate structure, a P-well, and a field oxide (FOX) isolation structure 60.

Optionally, the first electrode layer is an anode layer, and the second electrode layer is a cathode layer. Optionally, the first electrode layer is a cathode layer, and the second electrode layer is an anode layer.

As shown in FIG. 1A, the first electrode blocks 4A are in the first region 2, and the second electrode block 4B is in the second region 3. Each of the first electrode blocks 4A corresponds to one of subpixels 11A, 11B, 11C. The second electrode block 4B corresponds to subpixel 11D.

In some embodiments, the touch display substrate includes a light emitting layer 6 on a side of the first electrode layer 4 distal to the base substrate 20. The pattern spacer layer 5 divides the light emitting layer 6 into a first light emitting layer 6A in the first region 2 and a second light emitting layer 6B in the second region 3, i.e., the first light emitting layer 6A and the second light emitting layer 6B are spaced apart by the pattern spacer layer 5. The first light emitting layer 6A corresponds to subpixels 11A, 11B, and 11C, and the second light emitting layer 6B corresponds to subpixel 11D. Because the pattern spacer layer 5 is made of electrically non-conductive material such as a photoresist, the first light emitting layer 6A and the second light emitting layer 6B are also electrically insulated by the pattern spacer layer 5.

The first light emitting layer 6A and the second light emitting layer 6B may be made in a single process, e.g., a single deposition process. Thus, the first light emitting layer 6A and the second light emitting layer 6B may be in a same layer. Optionally, the first light emitting layer 6A and the second light emitting layer 6B may be made in two deposition processes. Accordingly, the first light emitting layer 6A and the second light emitting layer 6B may be in different layers.

As shown in FIG. 1A, the first light emitting layer 6A is on a side of the first electrode blocks 4A distal to the base substrate 20, and the second light emitting layer 6B is on side of the second electrode blocks 4B distal to the base substrate 20.

Referring to FIG. 1A, the touch display substrate in the embodiment further includes a second electrode layer 7A on a side of the light emitting layer 6 distal to the first electrode layer 4. Specifically, the second electrode layer 7A is on a side of the first light emitting layer 6A distal to the first electrode blocks 4A. The second electrode layer 7A is in the first region 2. Optionally, the second electrode layer 7A is an integral electrode layer.

Referring to FIG. 1A, the touch display substrate in the embodiment further includes a touch electrode layer 7B on a side of the light emitting layer 6 distal to the first electrode layer 4. Specifically, the touch electrode layer 7B is on a side of the second light emitting layer 6B distal to the second electrode block 4B. The touch electrode layer 7B is in the second region 3. Optionally, the touch electrode layer 7B is an integral electrode layer.

As shown in FIG. 1A, the first light emitting layer 6A is on a side of the second electrode layer 7A proximal to the base substrate 20, and the second light emitting layer 6B is on side of the touch electrode layer 7B proximal to the base substrate 20.

In some embodiments, the touch display substrate includes one or more organic layer between the first light emitting layer 6 and the first electrode layer 4. Optionally, the touch display substrate includes one or more organic layer between the first light emitting layer 6A and the first electrode layer 4 in the first region (e.g., the first electrode block 4A). Optionally, the touch display substrate includes one or more organic layer between the second light emitting layer 6B and the first electrode layer 4 in the second region (e.g., the second electrode block 4B). In some embodiments, the touch display substrate includes one or more organic layer between the first light emitting layer 6A and the second electrode layer 7A. In some embodiments, the touch display substrate includes one or more organic layer between the second light emitting layer 6B and the touch electrode layer 7B. Optionally, the one or more organic layer is a carrier transport layer such as a hole transport layer or an electron transport layer. Optionally, the one or more organic layer is a carrier injection layer such as a hole injection layer or an electron injection layer.

Optionally, the first light emitting layer 6A is an integral white light emitting layer. Optionally, the second light emitting layer 6B is an integral white light emitting layer. Optionally, the first light emitting layer 6A and the second light emitting layer 6B are formed in a single process.

Optionally, the first light emitting layer 6A includes a plurality of light emitting blocks, each of which is capable of emitting a light of a different color, e.g., a red light emitting block, a green light emitting block, a blue light emitting block, or a white light emitting block. Each light emitting block corresponds to a subpixel, e.g., subpixel 11A, 11B, or 11C. Each light emitting block corresponds to a first electrode block 4A. Optionally, the touch display substrate includes a pixel definition layer insulating each of the light emitting blocks. Optionally, the light emitting blocks include a red light emitting layer. Optionally, the light emitting blocks include a green light emitting layer. Optionally, the light emitting blocks include a blue light emitting layer. Optionally, the light emitting blocks include a white light emitting layer. In some embodiments, the touch display substrate includes one or more organic layer between a first light emitting block and a first electrode block 4A. In some embodiments, the touch display substrate includes one or more organic layer between a first light emitting block and the second electrode layer 7A. Optionally, the one or more organic layer is a carrier transport layer such as a hole transport layer or an electron transport layer. Optionally, the one or more organic layer is a carrier injection layer such as a hole injection layer or an electron injection layer.

The pattern spacer layer 5 separates the second electrode layer 7A in the first region 2 apart from the touch electrode layer 7B in the second region 3, i.e., the second electrode layer 7A and the touch electrode layer 7B are spaced apart by the pattern spacer layer 5. The second electrode layer 7A corresponds to subpixels 11A, 11B, and 11C, and the touch electrode layer 7B corresponds to subpixel 11D. Because the pattern spacer layer 5 is made of non-conductive material such as a photoresist, the second electrode layer 7A and the touch electrode layer 7B are also electrically insulated by the pattern spacer layer 5.

The second electrode layer 7A and the touch electrode layer 7B may be made in a single process, e.g., a single deposition process. Thus, the second electrode layer 7A and the touch electrode layer 7B may be in a same layer.

Optionally, the second electrode layer 7A and the touch electrode layer 7B may be made in two deposition processes. Accordingly, the second electrode layer 7A and the touch electrode layer 7B may be in different layers.

In some embodiments, the second electrode block 4B in the second region is electrically connected to the touch electrode layer 7B. Various embodiments may be practiced to electrically connect the second electrode block 4B to the touch electrode layer 7B. For example, the second electrode block 4B and the touch electrode layer 7B may be electrically connected through a via extending through the second light emitting layer 6B. As discussed hereinthroughout, the second electrode block 4B and the touch electrode layer 7B may also be electrically connected through a conductive channel in the second light emitting layer 6B. The conductive channel includes a sintered conductive material including a light emitting material, a conductive material of the second electrode block in the second region, and a conductive material of the touch electrode layer.

Figure 1B:
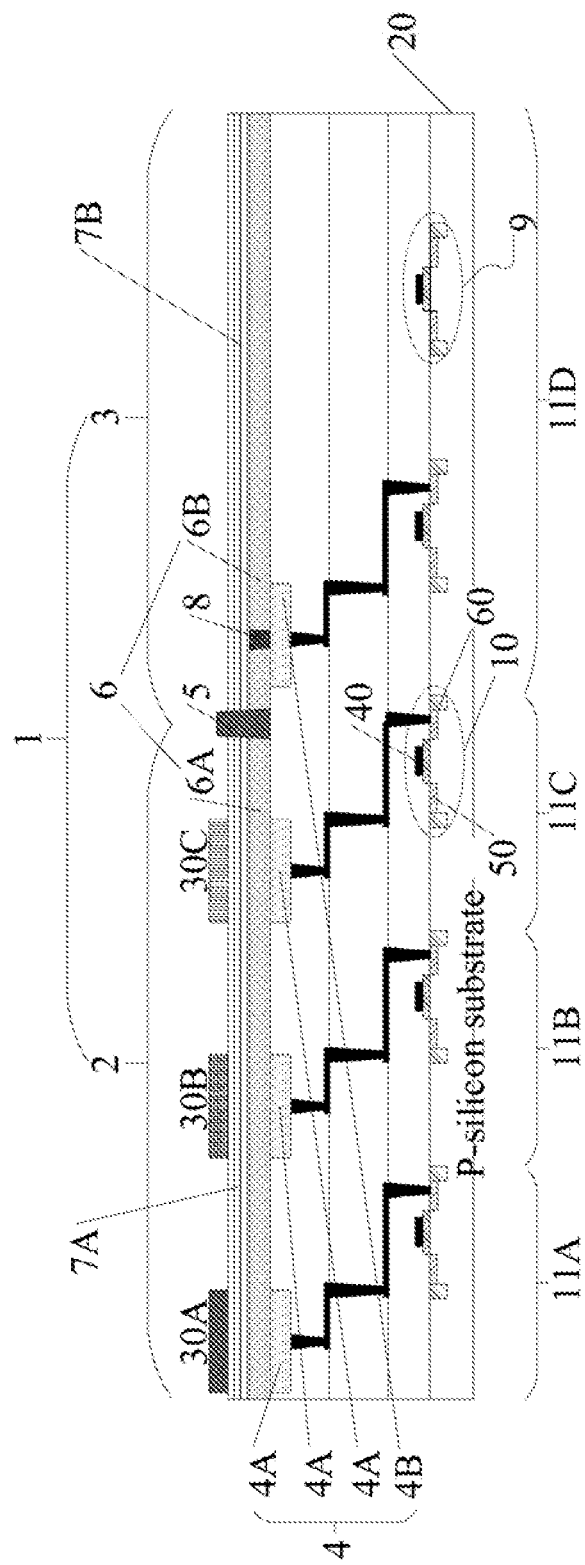
FIG. 1B is a diagram illustrating the structure of a touch display substrate in some embodiments.

FIG. 1B is a diagram illustrating the structure of a touch display substrate in some embodiments. Referring to FIG. 1B, the touch display substrate in the embodiment includes a conductive channel 8 in the second light emitting layer 6B. The conductive channel 8 may be formed by sintering the second light emitting layer 6B, the touch electrode layer 7B, and the second electrode block 4B, e.g., by a laser. The conductive channel 8 includes a sintered conductive material including at least one of a light emitting material of the second light emitting layer 6B, a conductive material of the second electrode block 4B, and a conductive material of the touch electrode layer 7B. Optionally, a portion of the touch electrode layer 7B corresponding to the conductive channel 8 also includes a sintered material comprising at least a conductive material of the touch electrode layer 7B and a light emitting material of the second light emitting layer 6B. Optionally, a portion of the second electrode block 4B corresponding to the conductive channel 8 also includes a sintered material comprising at least a conductive material of the second electrode block 4B and a light emitting material of the second light emitting layer 6B. The conductive channel 8 is at least partially sintered so that the conductive channel 8 becomes electrically conductive, electrically connecting the second electrode block 4B and the touch electrode layer 7B.

In some embodiments, touch display substrate includes an additional layer between the second light emitting layer 6B and the second electrode block 4B in the second region, or between the second light emitting layer 6B and the touch electrode layer 7B. Optionally, the touch display substrate includes one or more organic layer between the second light emitting layer 6B and the second electrode block 4B in the second region. Optionally, the touch display substrate includes one or more organic layer between the second light emitting layer 6B and the touch electrode layer 7B. Optionally, the one or more organic layer is a carrier transport layer such as a hole transport layer or an electron transport layer. Optionally, the one or more organic layer is a carrier injection layer such as a hole injection layer or an electron injection layer.

Accordingly, the conductive channel 8 may optionally include a sintered conductive material including a light emitting material of the second light emitting layer 6B, a conductive material of the second electrode block 4B, a conductive material of the touch electrode layer 7B, and a material of the additional layer between the second light emitting layer 6B and the second electrode block 4B in the second region, or between the second light emitting layer 6B and the touch electrode layer 7B. Examples of the additional layers include a carrier transport layer such as a hole transport layer or an electron transport layer and a carrier injection layer such as a hole injection layer or an electron injection layer. Optionally, the conductive channel 8 includes a sintered conductive material including a light emitting material of the second light emitting layer 6B, a conductive material of the second electrode block 4B, a conductive material of the touch electrode layer 7B, and a material of a carrier transport layer (e.g., a hole transport layer or an electron transport layer). Optionally, the conductive channel 8 includes a sintered conductive material including a light emitting material of the second light emitting layer 6B, a conductive material of the second electrode block 4B, a conductive material of the touch electrode layer 7B, and a material of a carrier injection layer (e.g., a hole injection layer or an electron injection layer). Optionally, the conductive channel 8 includes a sintered conductive material including a light emitting material of the second light emitting layer 6B, a conductive material of the second electrode block 4B, a conductive material of the touch electrode layer 7B, a material of a carrier transport layer (e.g., a hole transport layer or an electron transport layer), and a material of a carrier injection layer (e.g., a hole injection layer or an electron injection layer).

Figure 1C:
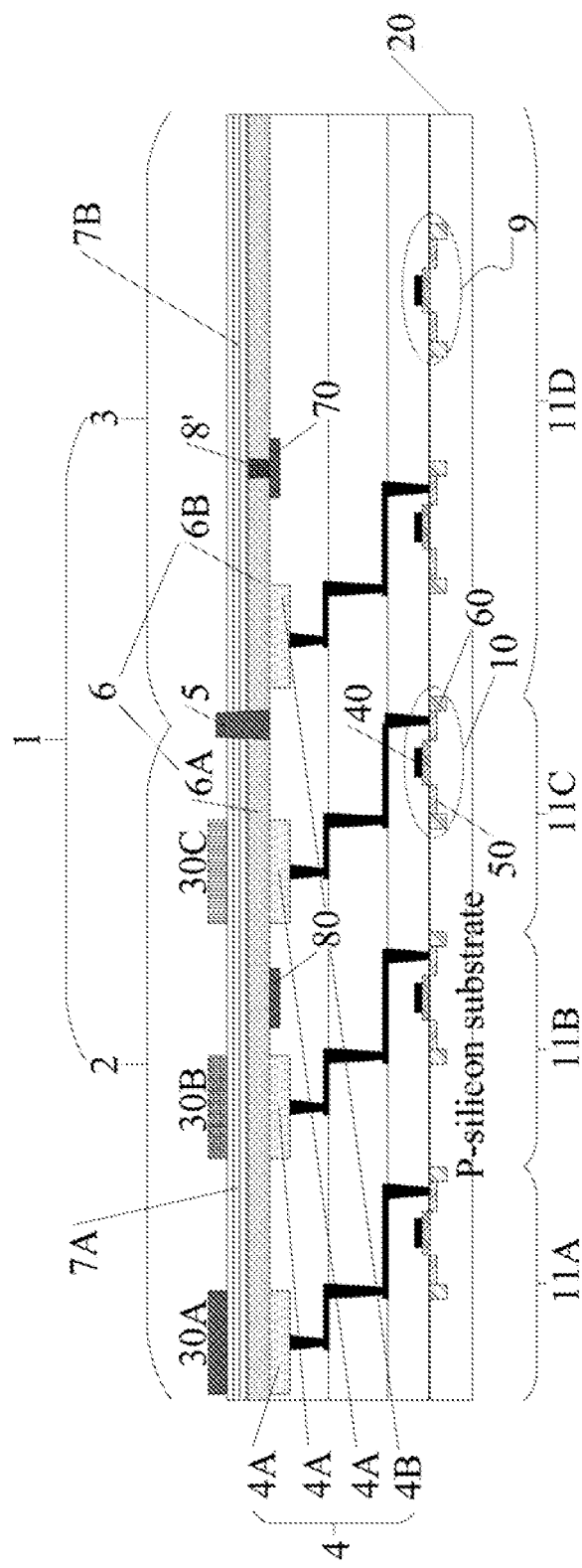
FIG. 1C is a diagram illustrating the structure of a touch display substrate in some embodiments.

FIG. 1C is a diagram illustrating the structure of a touch display substrate in some embodiments. Referring to FIG. 1C, the touch display substrate in the embodiment includes a conductive channel 8' in the second light emitting layer 6B. As shown in FIG. 1C, the touch display substrate in the embodiment includes a plurality of electrode lead wires 80 in the first region and a plurality of touch control lead wires 70 in the second region. The plurality of touch control lead wires 70 are in a same layer as the plurality of electrode lead wires 80. The plurality of touch control lead wires 70 may be electrically connected to the touch electrode layer 7B through a conductive channel 8' in the second light emitting layer 6B. The conductive channel 8' may be formed by sintering the second light emitting layer 6B, the touch electrode layer 7B, and the touch control lead wires 70, e.g., by a laser. The conductive channel 8' includes a sintered conductive material including at least one of a light emitting material of the second light emitting layer 6B, a conductive material of the touch control lead wires 70, and a conductive material of the touch electrode layer 7B. Optionally, a portion of the touch electrode layer 7B corresponding to the conductive channel 8' also includes a sintered material comprising at least a conductive material of the touch electrode layer 7B and a light emitting material of the second light emitting layer 6B. Optionally, a portion of the touch control lead wires 70 corresponding to the conductive channel 8' also includes a sintered material comprising at least a conductive material of the touch control lead wires 70 and a light emitting material of the second light emitting layer 6B. The conductive channel 8' is at least partially sintered so that the conductive channel 8' becomes electrically conductive, electrically connecting the touch control lead wires 70 and the touch electrode layer 7B.

In some embodiments, touch display substrate includes an additional layer between the second light emitting layer 6B and the touch control lead wires 70 in the second region, or between the second light emitting layer 6B and the touch electrode layer 7B. Optionally, the touch display substrate includes one or more organic layer between the second light emitting layer 6B and the touch control lead wires 70 in the second region. Optionally, the touch display substrate includes one or more organic layer between the second light emitting layer 6B and the touch electrode layer 7B. Optionally, the one or more organic layer is a carrier transport layer such as a hole transport layer or an electron transport layer. Optionally, the one or more organic layer is a carrier injection layer such as a hole injection layer or an electron injection layer.

Accordingly, the conductive channel 8' may optionally include a sintered conductive material including a light emitting material of the second light emitting layer 6B, a conductive material of the touch control lead wires 70, a conductive material of the touch electrode layer 7B, and a material of the additional layer between the second light emitting layer 6B and the touch control lead wires 70 in the second region, or between the second light emitting layer 6B and the touch electrode layer 7B. Examples of the additional layers include a carrier transport layer such as a hole transport layer or an electron transport layer and a carrier injection layer such as a hole injection layer or an electron injection layer. Optionally, the conductive channel 8' includes a sintered conductive material including a light emitting material of the second light emitting layer 6B, a conductive material of the touch control lead wires 70, a conductive material of the touch electrode layer 7B, and a material of a carrier transport layer (e.g., a hole transport layer or an electron transport layer). Optionally, the conductive channel 8' includes a sintered conductive material including a light emitting material of the second light emitting layer 6B, a conductive material of the touch control lead wires 70, a conductive material of the touch electrode layer 7B, and a material of a carrier injection layer (e.g., a hole injection layer or an electron injection layer). Optionally, the conductive channel 8' includes a sintered conductive material including a light emitting material of the second light emitting layer 6B, a conductive material of the touch control lead wires 70, a conductive material of the touch electrode layer 7B, a material of a carrier transport layer (e.g., a hole transport layer or an electron transport layer), and a material of a carrier injection layer (e.g., a hole injection layer or an electron injection layer).

Because the touch electrode layer 7B may be electrically connected to the touch control lead wires 70 through the conductive channel 8', touch control lead wires 70 may be connected to the touch electrode layer 7B through the conductive channel 8'. Accordingly, the touch control lead wires 70 may be formed in a same layer as electrode lead wires 80 for driving image display in the first region. Optionally, the touch control lead wires 70 are in a same layer as the first electrode lead wires. Optionally, the touch control lead wires 70 are in a same layer as the second electrode lead wires.

Referring to FIGS. 1A-1C, the touch display substrate in the embodiments further includes at least one pixel compensation circuit 9 in the second region. Examples of pixel compensation circuit 9 include, but are not limited to, a 6T1C circuit, a 2T1C circuit, a 4T1C circuit, and a 5T1C circuit.

In some embodiments, the touch display substrate includes a plurality of pixel compensation circuits 9 (e.g., 2, 3, 4, or more) in the second region. For example, the touch display substrate may include a plurality of pixel compensation circuits 9, each of which corresponding to a different subpixel (e.g., a red subpixel, a green subpixel, or a blue subpixel).

In another aspect, the present disclosure provides a novel pixel arrangement in the touch display substrate. In some embodiments, a pixel includes a subpixel of a first color, a subpixel of a second color, a subpixel of a third color, and a second region in the pixel is adjacent to a subpixel of the first color from a same pixel, a subpixel of the second color from a first adjacent pixel, and two subpixels of the third color respectively from a second and a third adjacent pixels. The first color, the second color, and the third color are three different colors, e.g., red, green, and blue.

Figure 2:
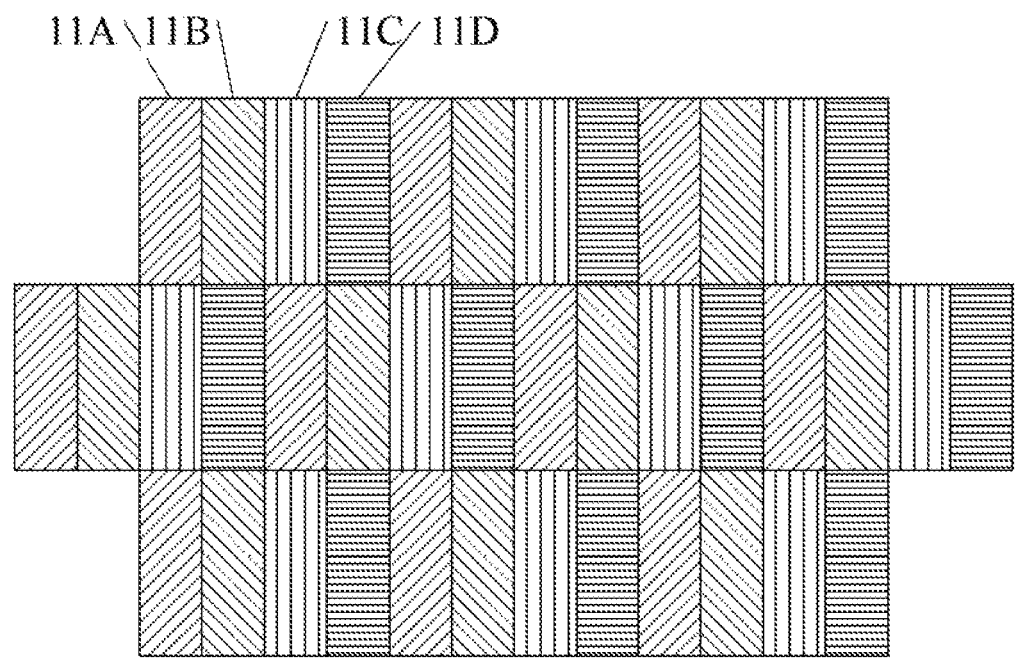
FIG. 2 is a diagram illustrating a pixel arrangement in a touch display substrate in some embodiments.

FIG. 2 is a diagram illustrating a pixel arrangement in a touch display substrate in some embodiments. Referring to FIG. 2, the touch display substrate in the embodiment includes a red subpixel 11A, a green subpixel 11B, a blue subpixel 11C, and a touch subpixel 11D. As discussed hereinthroughout, the pixel of the present disclosure includes a first region and a second region. The first region includes the red subpixel 11A, the green subpixel 11B, and the blue subpixel 11C capable of image display. The second region includes the touch subpixel 11D for touch control. Optionally, the touch subpixel 11D is also capable of image display. Each pixel also includes at least one pixel compensation circuit in the touch subpixel 11D. For example, each pixel may include at least three pixel compensation circuits in the touch subpixel 11D, each of which is connected to one of the red subpixel 11A, the green subpixel 11B, and the blue subpixel 11C.

Referring to FIG. 2, the second region (and the touch subpixel 11D) is surrounded by four subpixels, a blue subpixel 11C from the same pixel (on the left side of 11D), a red subpixel 11A from a first adjacent pixel (on the right side of 11D), and two green subpixels 11C from a second adjacent pixel and a third adjacent pixel (on the upper and low sides of 11D).

Figure 3:
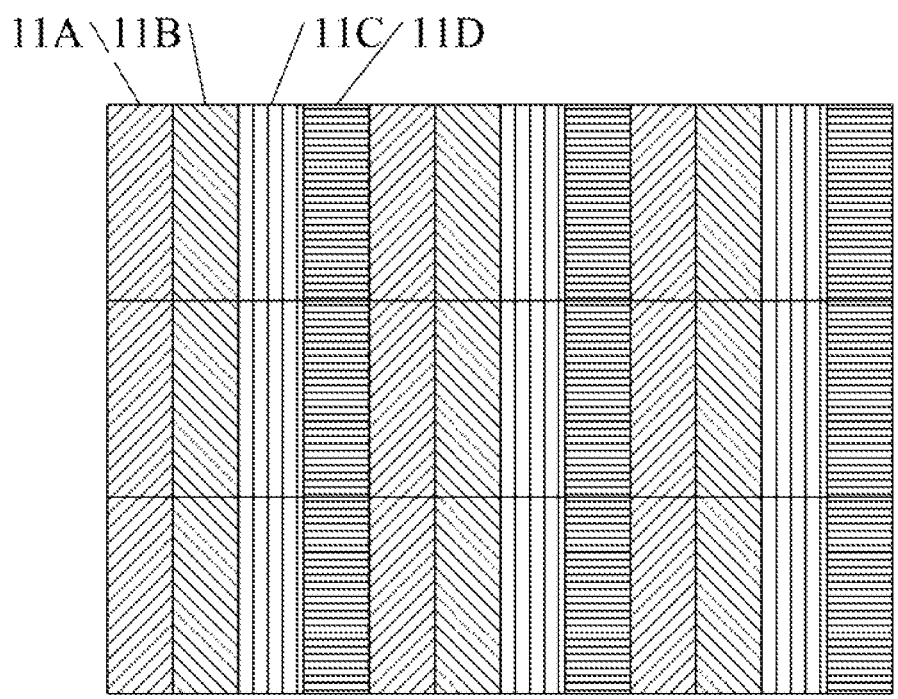
FIG. 3 is a diagram illustrating a pixel arrangement in a conventional touch display substrate.

FIG. 3 is a diagram illustrating a pixel arrangement in a conventional touch display substrate. Referring to FIG. 3, the second region (and the touch subpixel 11D) is surrounded by a blue subpixel 11C from the same pixel (on the left side of 11D), a red subpixel 11A from a first adjacent pixel (on the right side of 11D), and two touch subpixels 11D from a second adjacent pixel and a third adjacent pixel (on the upper and low sides of 11D). Thus, in the conventional touch display substrate, the second region is not surrounded by a green subpixel 11B. As such, it is difficult to dispose a pixel compensation circuit associated with a green subpixel 11B in the second region.

Figure 4:
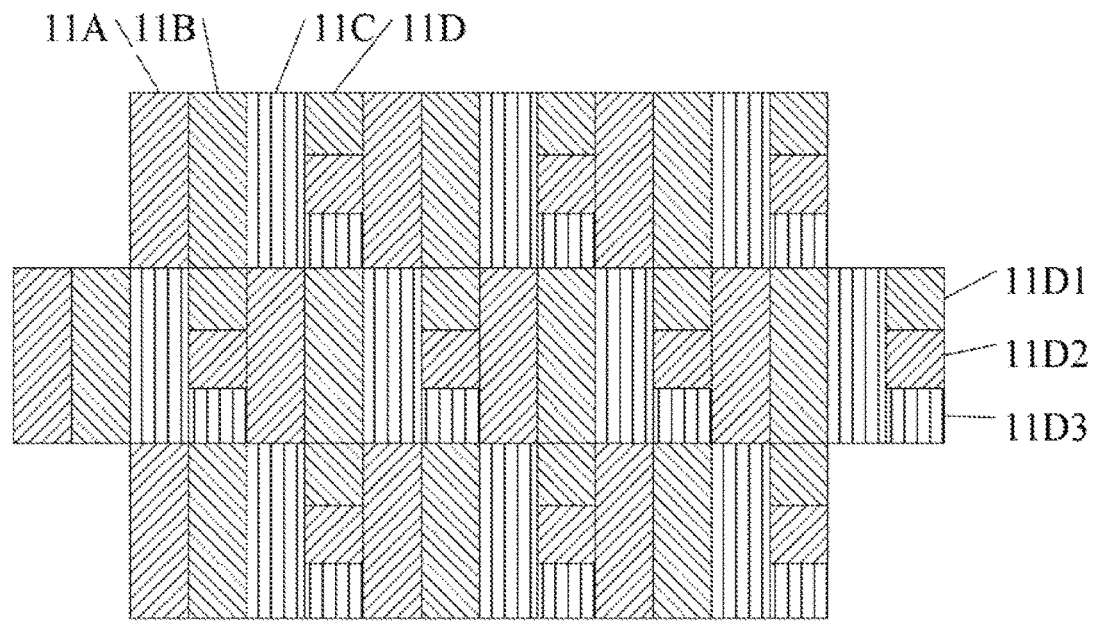
FIG. 4 is a diagram illustrating an arrangement for pixel compensation circuits in a touch display substrate in some embodiments.

As compared to the conventional touch display substrate, the second region in the present touch display substrate is surrounded by a red subpixel 11A, a blue subpixel 11C, and two green subpixels 11B. Accordingly, pixel compensation circuits associated with subpixels of all three colors may be conveniently disposed in a same second region. FIG. 4 is a diagram illustrating an arrangement for pixel compensation circuits in a touch display substrate in some embodiments. Referring to FIG. 4, each second region of each pixel includes three sections 11D1, 11D2, and 11D3, each of which includes a pixel compensation circuit. For example, the second region may include a pixel compensation circuit in 11D2 connected to a red subpixel from a first adjacent pixel (on the right side of touch subpixel), a pixel compensation circuit in 11D3 connected to a blue subpixel from a same pixel (on the left side of touch subpixel), and a pixel compensation circuit in 11D1 connected to a green subpixel from a second adjacent pixel (on the upper side of touch subpixel).

Figure 5:
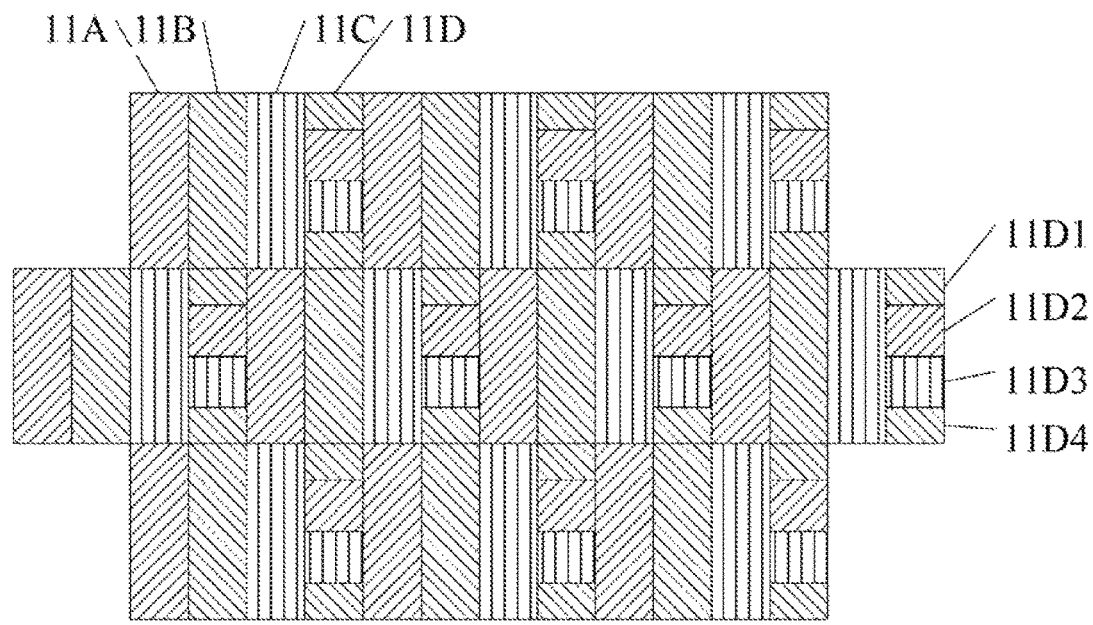
FIG. 5 is a diagram illustrating an arrangement for pixel compensation circuits in a touch display substrate in some embodiments.

The second region may include more than three pixel compensation circuits. FIG. 5 is a diagram illustrating an arrangement for pixel compensation circuits in a touch display substrate in some embodiments. Referring to FIG. 5, each second region of each pixel includes four sections 11D1, 11D2, 11D3, and 11D4, each of which includes a pixel compensation circuit. For example, the second region may include a pixel compensation circuit in 11D2 connected to a red subpixel from a first adjacent pixel (on the right side of touch subpixel), a pixel compensation circuit in 11D3 connected to a blue subpixel from a same pixel (on the left side of touch subpixel), a pixel compensation circuit in 11D1 connected to a green subpixel from a second adjacent pixel (on the upper side of touch subpixel), and a pixel compensation circuit in 11D4 connected to a green subpixel from a third adjacent pixel (on the lower side of touch subpixel).

In some embodiments, the touch electrode layer is operated in a time-division driving mode. For example, the time-division driving mode may include a display mode and a touch control mode. The touch electrode layer is a touch control electrode for conducting touch signals during the touch control mode. In display mode, the second electrode block in the second region and the touch electrode layer are electrodes for applying voltage signal to the second light emitting layer for image display during display mode. Optionally, when the touch electrode layer is operated in a time-division driving mode, the second region may further include a pixel compensation circuit for the touch subpixel. For example, the second region may include a pixel compensation circuit in 11D2 connected to a red subpixel from a first adjacent pixel (on the right side of touch subpixel), a pixel compensation circuit in 11D3 connected to a blue subpixel from a same pixel (on the left side of touch subpixel), a pixel compensation circuit in 11D1 connected to a green subpixel from a second adjacent pixel (on the upper side of touch subpixel), and a pixel compensation circuit in 11D4 for the touch subpixel itself.

Referring to FIGS. 1A and 1B, the light emitting layer in the embodiments is a white light emitting layer (including the first light emitting layer 6A and the second light emitting layer 6B). As shown in FIGS. 1A and 1B, each pixel further includes a plurality of color filters 30A, 30B, and 30C, in the first region 2. Each of the plurality of color filters 30A, 30B, and 30C corresponds to a subpixel. For example, the color filter 30A may be a red color filter corresponding to a red subpixel, the color filter 3020 may be a green color filter corresponding to a green subpixel, and the color filter 30 may be a blue color filter corresponding to a blue subpixel. Optionally, the first light emitting layer 6A is an integral light emitting layer.

Figure 6:
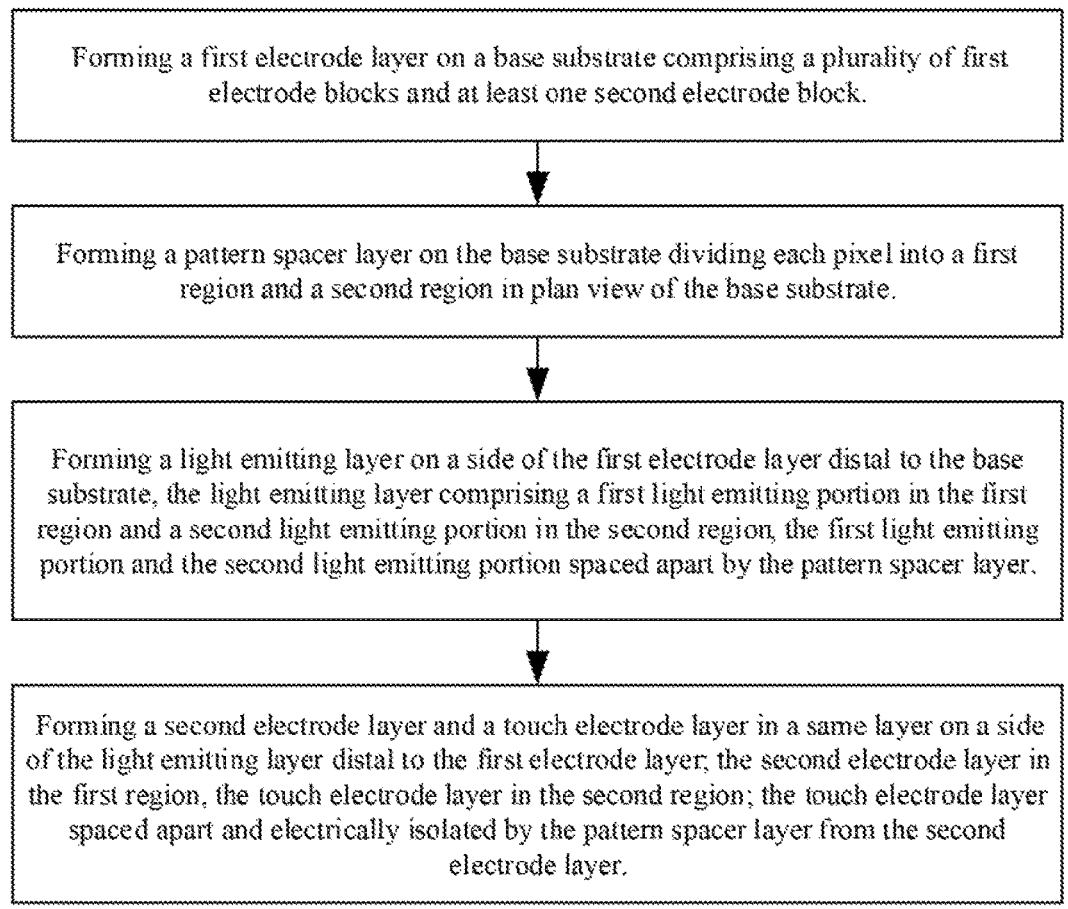
FIG. 6 is a flow chart illustrating a method of fabricating a touch display substrate in some embodiments.

In another aspect, the present disclosure provides a method of fabricating a touch display substrate. In some embodiments, the method includes forming an array of a plurality of pixels. FIG. 6 is a flow chart illustrating a method of fabricating a touch display substrate in some embodiments. Referring to FIG. 6, the step of forming each pixel in the embodiment includes forming a first electrode layer on a base substrate comprising a plurality of first electrode blocks and a second electrode block; forming a pattern spacer layer on the base substrate dividing each pixel into a first region and a second region in plan view of the base substrate; forming a light emitting layer on a side of the first electrode layer distal to the base substrate, the light emitting layer comprising a first light emitting layer in the first region and a second light emitting layer in the second region, the first light emitting layer and the second light emitting layer spaced apart by the pattern spacer layer; and forming a second electrode layer and a touch electrode layer in a same layer on a side of the light emitting layer distal to the first electrode layer; the second electrode layer in the first region, the touch electrode layer in the second region; the touch electrode layer spaced apart and electrically insulated by the pattern spacer layer from the second electrode layer.

Figure 7A:
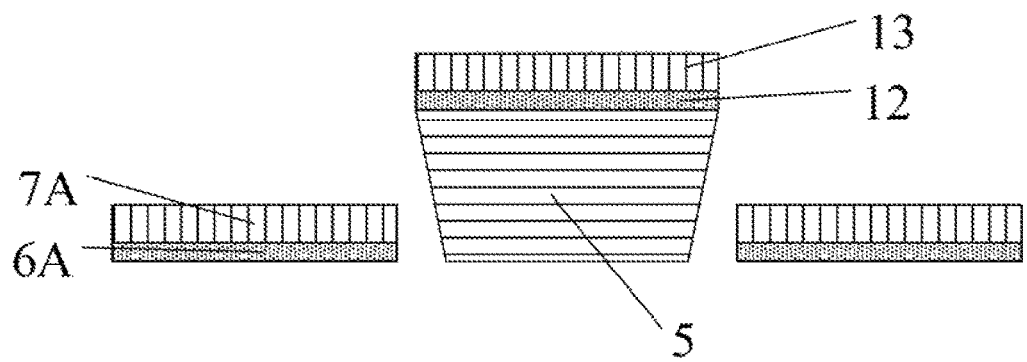
FIG. 7A is a diagram illustrating the structure of a pattern spacer layer in some embodiments.
Figure 7B:
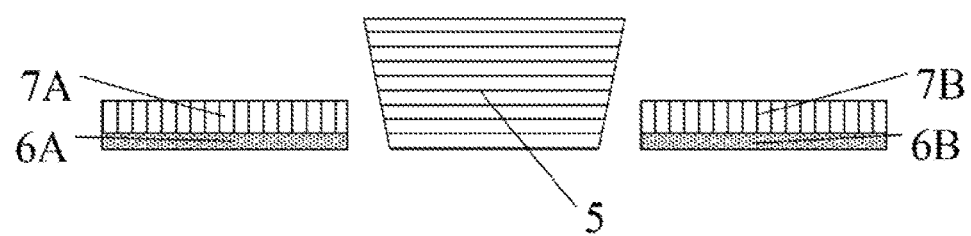
FIG. 7B is a diagram illustrating the structure of a pattern spacer layer in some embodiments.

Various appropriate materials may be used for making the pattern spacer layer. In some embodiments, the pattern spacer layer is made of a photoresist material. FIG. 7A is a diagram illustrating the structure of a pattern spacer layer in some embodiments. Referring to FIG. 7A, the pattern spacer layer 5 is formed on the base substrate, and a light emitting material and an electrode material are sequentially deposited on the base substrate having the pattern spacer layer 5. The first light emitting layer 6A and the second electrode layer 7A are formed in the first region. The second light emitting layer 6B and the touch electrode layer 7B are formed in the second region. As shown in FIG. 7B, the pattern spacer layer electrically insulates the first light emitting layer 6A in the first region and the second light emitting layer 6B in the second region; and insulates the second electrode layer 7A in the first region and the touch electrode layer 7B in the second region.

During the deposition process, the light emitting material and the electrode material may also be deposited on the pattern spacer layer 5, forming a third light emitting portion 12 and an electrode layer 13 on the pattern spacer layer 5. Optionally, the third light emitting portion 12 and an electrode layer 13 may be removed (e.g., by etching, ashing, etc.) subsequent to the formation of the first light emitting layer 6A, the second electrode layer 7A, the second light emitting layer 6B and the touch electrode layer 7B. FIG. 7B is a diagram illustrating the structure of a pattern spacer layer in some embodiments. Referring to FIG. 7B, the pattern spacer layer 5 is formed on the base substrate, and a light emitting material and an electrode material are sequentially deposited on the base substrate having the pattern spacer layer 5. The light emitting material and electrode material on the pattern spacer layer 5 are removed.

Accordingly, in some embodiments, the step of forming each pixel includes depositing a photoresist layer on the base substrate having the first electrode layer; exposing the photoresist layer with a mask plate having a pattern corresponding to the pattern spacer layer; and developing the exposed photoresist layer thereby forming the pattern spacer layer. Once the pattern spacer layer is formed, the step may further include depositing an organic light emitting material layer on a side of the first electrode layer distal to the base substrate having the pattern spacer layer, thereby forming the first light emitting layer in the first region and the second light emitting layer in the second region. The first light emitting layer in the first region and the second light emitting layer in the second region may be formed in a single deposition step. Optionally, the first light emitting layer in the first region and the second light emitting layer in the second region may be formed separately in two processes. Once the first light emitting layer in the first region and the second light emitting layer in the second region are formed, the step may further include depositing an electrode material layer on a side of the organic light emitting material layer distal to the first electrode layer, thereby forming the second electrode layer in the first region and the touch electrode layer in the second region. The second electrode layer in the first region and the touch electrode layer in the second region may be formed in a single deposition step. Optionally, the second electrode layer in the first region and the touch electrode layer in the second region may be formed separately in two processes.

Optionally, the first light emitting layer in the first region and the second light emitting layer in the second region are formed in a single deposition step, and the second electrode layer in the first region and the touch electrode layer in the second region are formed in a single deposition step. Optionally, any light emitting material and electrode material deposited on a side of the pattern spacer layer distal to the base substrate may be removed.

In some embodiments, the step of forming the first electrode layer includes forming a plurality of first electrode blocks in the first region, each of which corresponding to a subpixel; and forming a second electrode block in the second region. The plurality of first electrode blocks in the first region and the second electrode block in the second region may be formed in a single process, e.g., by a single deposition process, and using a single mask for patterning. Optionally, the plurality of first electrode blocks in the first region and the second electrode block in the second region are formed separately.

In some embodiments, the step of forming each pixel further includes electrically connecting the second electrode block in the second region to the touch electrode layer. Various appropriate methods may be practiced to electrically connect the second electrode block to the touch electrode layer. For example, the step may include forming a via extending through the second light emitting layer thereby electrically connecting the second electrode block and the touch electrode layer.

In some embodiments, the step of electrically connecting the second electrode block in the second region to the touch electrode layer includes sintering a portion of a multilayer structure including the second electrode block in the second region, the second light emitting layer, and the touch electrode layer; and forming conductive channel in the second light emitting layer. The conductive channel includes a sintered conductive material having a light emitting material, a conductive material of the second electrode block, and a conductive material of the touch electrode layer. Optionally, the sintering step may be performed by a laser. The conductive channel is at least partially sintered so that the conductive channel is electrically conductive, electrically connecting the second electrode block and the touch electrode layer.

As discussed hereinthroughout, touch display substrate may include an additional layer between the second light emitting layer and the second electrode block in the second region, or between the second light emitting layer and the touch electrode layer. Optionally, the touch display substrate includes one or more organic layer between the second light emitting layer and the second electrode block in the second region. Optionally, the touch display substrate includes one or more organic layer between the second light emitting layer and the touch electrode layer. Optionally, the one or more organic layer is a carrier transport layer such as a hole transport layer or an electron transport layer. Optionally, the one or more organic layer is a carrier injection layer such as a hole injection layer or an electron injection layer.

Accordingly, the sintering step may optionally include sintering a portion of a multilayer structure including the second electrode block in the second region, the second light emitting layer, the touch electrode layer; the additional layer(s) between the second light emitting layer and the second electrode block in the second region; and the additional layer(s) between the second light emitting layer and the touch electrode layer. Examples of the additional layers include a carrier transport layer such as a hole transport layer or an electron transport layer and a carrier injection layer such as a hole injection layer or an electron injection layer.

In some embodiments, the step of forming each pixel further includes electrically connecting a plurality of touch control lead wires in the second region to the touch electrode layer. Various appropriate methods may be practiced to electrically connect the plurality of touch control lead wires to the touch electrode layer. For example, the step may include forming a via extending through the second light emitting layer thereby electrically connecting the touch control lead wires and the touch electrode layer.

In some embodiments, the step of electrically connecting the touch control lead wires in the second region to the touch electrode layer includes sintering a portion of a multilayer structure including the touch control lead wires in the second region, the second light emitting layer, and the touch electrode layer; and forming conductive channel in the second light emitting layer. The conductive channel includes a sintered conductive material having at least one of a light emitting material, a conductive material of the touch control lead wires, and a conductive material of the touch electrode layer. Optionally, the sintering step may be performed by a laser. The conductive channel is at least partially sintered so that the conductive channel is electrically conductive, electrically connecting the touch control lead wires and the touch electrode layer.

As discussed hereinthroughout, touch display substrate may include an additional layer between the second light emitting layer and the touch control lead wires in the second region, or between the second light emitting layer and the touch electrode layer. Optionally, the touch display substrate includes one or more organic layer between the second light emitting layer and the touch control lead wires in the second region. Optionally, the touch display substrate includes one or more organic layer between the second light emitting layer and the touch electrode layer. Optionally, the one or more organic layer is a carrier transport layer such as a hole transport layer or an electron transport layer. Optionally, the one or more organic layer is a carrier injection layer such as a hole injection layer or an electron injection layer.

Accordingly, the sintering step may optionally include sintering a portion of a multilayer structure including the touch control lead wires in the second region, the second light emitting layer, the touch electrode layer; the additional layer(s) between the second light emitting layer and the touch control lead wires in the second region, and the additional layer(s) between the second light emitting layer and the touch electrode layer. Examples of the additional layers include a carrier transport layer such as a hole transport layer or an electron transport layer and a carrier injection layer such as a hole injection layer or an electron injection layer.

In some embodiments, the step of forming each pixel further includes forming a pixel compensation circuit in the second region. Optionally, the step includes forming a plurality of pixel compensation circuits in the second region.

In some embodiments, the first region includes a subpixel of a first color, a subpixel of a second color, a subpixel of a third color. The step of forming each pixel includes forming a plurality of pixel compensation circuits in the second region, each of which connected to one of the subpixel of the first color from a same pixel, the subpixel of the second color and the subpixel of the third color from adjacent pixels. The method includes forming the array of the plurality of pixels so that each second region is surrounded by the subpixel of the first color from a same pixel, the subpixel of the second color from an adjacent pixel, and two subpixels of the third color respectively from two other adjacent pixels.

In some embodiments, the step of forming the plurality of pixel compensation circuits in a single second region includes forming a pixel compensation circuit connected to a subpixel of a first color from a same pixel, a pixel compensation circuit connected to a subpixel of a second color from a first adjacent pixel, and two pixel compensation circuits connected to two subpixels of a third color from a second and a third adjacent pixels, respectively.

In some embodiments, the step of forming the plurality of pixel compensation circuits in a single second region includes forming a pixel compensation circuit connected to a subpixel of a first color from a same pixel, a pixel compensation circuit connected to a subpixel of a second color from a first adjacent pixel, a pixel compensation circuit connected to a subpixel of a third color from a second adjacent pixel, and a pixel compensation circuit connected the touch subpixel itself.

In another aspect, the present disclosure provides a touch display apparatus having a touch display substrate described herein or fabricated by a method described herein. In some embodiments, the touch display substrate is an organic light emitting substrate, and the touch display apparatus is an organic light emitting apparatus. Examples of touch display apparatuses include, but are not limited to, an electronic paper, a mobile phone, a tablet computer, a television, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch display substrate, comprising: an array of a plurality of pixels, each pixel having a first region and a second region in plan view of the touch display substrate, each pixel comprising:
   a first electrode layer on a base substrate comprising a plurality of first electrode blocks in the first region, each of which corresponding to a subpixel; and a second electrode block in the second region;

a first light emitting layer in the first region on a side of the plurality of first electrode blocks distal to the base substrate;

a second light emitting layer in the second region on a side of the second electrode block distal to the base substrate;

a second electrode layer in the first region on a side of the first light emitting layer distal to the plurality of first electrode blocks; and a touch electrode layer in the second region on a side of the second light emitting layer distal to the second electrode block; the touch electrode layer and the second electrode layer spaced apart and electrically insulated from each other;

wherein each pixel comprises a subpixel of a first color, a subpixel of a second color, a subpixel of a third color in the first region, and a plurality of pixel compensation circuits in the second region; each pixel compensation circuit is connected to one of the subpixel of the first color from a same pixel, the subpixel of the second color and the subpixel of the third color from adjacent pixels.

2. The touch display substrate of claim 1, wherein each pixel further comprises a pattern spacer layer on the base substrate dividing the pixel into the first region and the second region; the pattern spacer layer spacing apart and electrically insulating the touch electrode layer and the second electrode layer; and the pattern spacer layer spacing apart and electrically insulating the first light emitting layer and the second light emitting layer.

3. The touch display substrate of claim 1, wherein the touch electrode layer is in a same layer as the second electrode layer, and the first light emitting layer is in a same layer as the second light emitting layer.

4. The touch display substrate of claim 1, wherein one second electrode block in the second region is electrically connected to the touch electrode layer.

5. The touch display substrate of claim 4, wherein the one second electrode block in the second region is electrically connected to the touch electrode layer through a conductive channel in the second light emitting layer, the conductive channel comprising a sintered conductive material comprising at least one of a light emitting material of the second light emitting layer, a conductive material of the one second electrode block in the second region, and a conductive material of the touch electrode layer.

6. The touch display substrate of claim 1, further comprising a plurality of electrode lead wires in the first region and a plurality of touch control lead wires in the second region; the plurality of touch control lead wires in a same layer as the plurality of electrode lead wires; the plurality of touch control lead wires electrically connected to the touch electrode layer through a conductive channel in the second light emitting layer, the conductive channel comprising a sintered conductive material comprising at least one of a light emitting material of the second light emitting layer, a conductive material of a touch control lead wire in the second region, and a conductive material of the touch electrode layer.

7. The touch display substrate of claim 1, wherein each second region is surrounded by the subpixel of the first color from the same pixel, the subpixel of the second color from a first adjacent pixel, and two subpixels of the third color respectively from a second and a third adjacent pixels; the first color, the second color, and the third color are different colors selected form red, green, and blue.

8. The touch display substrate of claim 1, wherein each pixel comprises three pixel compensation circuits, each pixel compensation circuit is connected to one of the subpixel of the first color from a same pixel, the subpixel of the second color from a first adjacent pixel, and the subpixel of the third color from a second adjacent pixel.

9. The touch display substrate of claim 1, wherein each pixel comprises four pixel compensation circuits, each pixel compensation circuit is connected to one of the subpixel of the first color from a same pixel, the subpixel of the second color from a first adjacent pixel, the subpixel of the third color from a second adjacent pixel, and the subpixel of the third color from a third adjacent pixel.

10. The touch display substrate of claim 1, wherein each pixel further comprises a touch subpixel in the second region, the touch electrode layer is configured to operate in a time-division driving mode, the time-division mode comprising a display mode and a touch control mode, the touch electrode layer is a touch control electrode for conducting touch signals during the touch control mode, and one second electrode block in the second region and the touch electrode layer are electrodes for applying voltage signal to the second light emitting layer during display mode;

each pixel further comprises four pixel compensation circuits, each pixel compensation circuit is connected to one of the subpixel of the first color from a same pixel, the subpixel of the second color from a first adjacent pixel, the subpixel of the third color from a second adjacent pixel, and the touch subpixel.

11. A touch display apparatus comprising a touch display substrate of claim 1.

12. A pixel arrangement, comprising an array of a plurality of pixels, wherein each pixel comprises a subpixel of a first color, a subpixel of a second color, a subpixel of a third color, a touch subpixel; and a plurality of pixel compensation circuits in the touch subpixel;

each pixel compensation circuit is connected to one of the subpixel of the first color from a same pixel, the subpixel of the second color and the subpixel of the third color from adjacent pixels; and each touch subpixel is surrounded by the subpixel of the first color from a same pixel, the subpixel of the second color from a first adjacent pixel, and two subpixels of the third color respectively from a second and a third adjacent pixels.

13. The pixel arrangement of claim 12, wherein each pixel comprises three pixel compensation circuits, each pixel compensation circuit is connected to one of the subpixel of the first color from a same pixel, the subpixel of the second color from a first adjacent pixel, the subpixel of the third color from a second adjacent pixel.

14. The pixel arrangement of claim 12, wherein each pixel comprises four pixel compensation circuits, each pixel compensation circuit is connected to one of the subpixel of the first color from a same pixel, the subpixel of the second color from a first adjacent pixel, the subpixel of the third color from a second adjacent pixel, and the subpixel of the third color from a third adjacent pixel.

15. A method of fabricating a touch display substrate, comprising forming an array of a plurality of pixels, each pixel comprising a first region and a second region in plan view of the touch display substrate; wherein forming each pixel comprising:

forming a first electrode layer on a base substrate; the step of forming the first electrode layer comprising forming a plurality of first electrode blocks in the first region, each of which corresponding to a subpixel; and forming a second electrode block in the second region;

forming a first light emitting layer in the first region on a side of the plurality of first electrode blocks distal to the base substrate;

forming a second light emitting layer in the second region on a side of the second electrode block distal to the base substrate;

forming a second electrode layer in the first region on a side of the first light emitting layer distal to the plurality of first electrode blocks;

forming a touch electrode layer in the second region on a side of the second light emitting layer distal to the second electrode block; the touch electrode layer and the second electrode layer spaced apart and electrically insulated from each other; and forming a pixel compensation circuit in the second region;

wherein the first region comprises a subpixel of a first color, a subpixel of a second color, a subpixel of a third color; forming each pixel comprises forming a plurality of pixel compensation circuits in the second region, each of which connected to one of the subpixel of the first color from a same pixel, the subpixel of the second color and the subpixel of the third color from adjacent pixels;

the method comprising:

forming the array of the plurality of pixels so that each second region is surrounded by the subpixel of the first color from a same pixel, the subpixel of the second color from an adjacent pixel, and two subpixels of the third color respectively from two other adjacent pixels.

16. The method of claim 15, further comprising forming a pattern spacer layer on the base substrate dividing each pixel into the first region and the second region; the pattern spacer layer spacing apart and electrically insulating the touch electrode layer and the second electrode layer, and the pattern spacer layer spacing apart and electrically insulating the first light emitting layer and the second light emitting layer;

wherein the pattern spacer layer is made of a photoresist material, the step of forming each pixel comprising:

depositing a photoresist layer on the base substrate having the first electrode layer;

exposing the photoresist layer with a mask plate having a pattern corresponding to the pattern spacer layer;

developing the exposed photoresist layer thereby forming the pattern spacer layer;

depositing an organic light emitting material layer on a side of the first electrode layer distal to the base substrate having the pattern spacer layer, thereby forming the first light emitting layer in the first region and the second light emitting layer in the second region; and depositing an electrode material layer on a side of the organic light emitting material layer distal to the first electrode layer, thereby forming the second electrode layer in the first region and the touch electrode layer in the second region.

17. The method of claim 16, further comprising electrically connecting one second electrode block in the second region to the touch electrode layer;

wherein the step of electrically connecting the one second electrode block in the second region to the touch electrode layer comprises sintering a portion of a multilayer structure comprising the one second electrode block in the second region, the second light emitting layer, and the touch electrode layer; and forming a conductive channel in the second light emitting layer, the conductive channel comprising a sintered conductive material comprising at least one of a light emitting material, a conductive material of the one second electrode block, and a conductive material of the touch electrode layer.

18. The method of claim 15, further comprising forming a plurality of electrode lead wires in the first region and a plurality of touch control lead wires in the second region in a same layer; and electrically connecting the plurality of touch control lead wires to the touch electrode layer through a conductive channel in the second light emitting layer;

wherein the step of electrically connecting the plurality of touch control lead wires to the touch electrode layer comprises sintering a portion of a multilayer structure comprising a touch control lead wire in the second region, the second light emitting layer, and the touch electrode layer; and forming a conductive channel in the second light emitting layer, the conductive channel comprising a sintered conductive material comprising at least one of a light emitting material, a conductive material of the touch control lead wire, and a conductive material of the touch electrode layer.

19. The pixel arrangement of claim 12, wherein each pixel comprises four pixel compensation circuits, each pixel compensation circuit is connected to one of the subpixel of the first color from a same pixel, the subpixel of the second color from a first adjacent pixel, the subpixel of the third color from a second adjacent pixel, and the touch subpixel.

20. The touch display substrate of claim 1, wherein the first light emitting layer is an integral white light emitting layer, each pixel further comprises a plurality of color filters on a side of the second electrode layer distal to the first light emitting layer, each of which corresponding to a subpixel.

* * * * *